US006440591B1

(12) United States Patent
Matsunaga et al.

(10) Patent No.: US 6,440,591 B1
(45) Date of Patent: *Aug. 27, 2002

(54) FERROELECTRIC THIN FILM COATED SUBSTRATE, PRODUCING METHOD THEREOF AND CAPACITOR STRUCTURE ELEMENT USING THEREOF

(75) Inventors: Hironori Matsunaga, Noda; Takeshi Kijima, Omiya; Sakiko Satoh, Yachiyo; Masayoshi Koba, Nara, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 08/646,630

(22) Filed: May 8, 1996

(51) Int. Cl.⁷ ................................................. B32B 9/00
(52) U.S. Cl. ...................... 428/699; 428/446; 428/697; 428/702; 361/312; 361/322; 427/79
(58) Field of Search .............................. 428/469, 446, 428/450, 689, 702, 432, 472, 697, 699; 361/271, 301.1, 312, 322; 427/79

(56) References Cited

U.S. PATENT DOCUMENTS

| 5,390,072 A | | 2/1995 | Anderson et al. | |
| 5,479,317 A | * | 12/1995 | Ramesh | 361/321.5 |
| 5,548,475 A | | 8/1996 | Ushikubo et al. | |
| 5,757,061 A | * | 5/1998 | Satoh et al. | 252/532 |
| 5,811,181 A | * | 9/1998 | Kijima et al. | 428/328 |

FOREIGN PATENT DOCUMENTS

| JP | 3 108 192 | 5/1991 |
| JP | 3 108 770 | 5/1991 |
| JP | 5 235 268 | 9/1993 |
| WO | WO 93/12538 | 6/1993 |
| WO | WO 94/10702 | 5/1994 |

OTHER PUBLICATIONS

Preparation of C–Axis–Oriented Bi4Ti3O12 Thin Films by Metalorganic Chemical Vapor Deposition, Takashi Nakamura et al, Jpn. J. Appl. Phys. vol. 32 (1993) pp. 4086–4088 Part 1, No. 9b, Sep. 1993.

Ultra–Thin Fatique Free Bi4Ti3O12 Thin Film for Nonvolatile Ferroelectric Memories T. Kijima et al, Extended Abstracts of the 1995 International Conference on Solid State Devices and Materiala, Osaka, 1995, pp. 1071–1072 (No month).

Ultra–Thin Fatique–Free Bi4Ti3O12 Films for nonvolatile Ferroelectric Memories, Takeshi Kijima et al, Jpn. J. Appl. Phys. vol. 35 (1996) pp. 1246–1250, Part 1, No. 2B, Feb. 1996.

Preparation of Bi4Ti3O12 Thin Films with c–axis Orientation by MOCVD Using Bi(oOC7H7)3 and Ti (i–Oc3H7) 2 (DPM) 2, Kuniaki Yoshimura et al, Journals of the Ceramic Society of Japan 102 [5] 512–515 (1994) (No month).

Extended Abstracts, The Japan Society of Applied Physics, The 55th Autumn Meeting, 1994 (20p–M–19). (No month).

(List continued on next page.)

*Primary Examiner*—Deborah Jones
*Assistant Examiner*—Andrew T Piziali
(74) *Attorney, Agent, or Firm*—Birch, Stewart, Kolasch & Birch, LLP

(57) ABSTRACT

A ferroelectric thin film coated substrate is obtained by a producing method of forming a metal oxide buffer layer on a substrate, forming a first crystalline ferroelectric thin film thereon by means of a MOCVD method and forming a second ferroelectric thin film with a film thickness thicker than that of the first ferroelectric thin film thereon by means of the MOCVD method at a temperature lower than that of the first ferroelectric thin film. This producing method makes it possible to produce a ferroelectric thin film, where its surface is dense and even, a leakage current properties are excellent and sufficiently large remanent spontaneous polarization is shown, at a lower temperature.

13 Claims, 5 Drawing Sheets

OTHER PUBLICATIONS

Extended Abstracts, The Japan Society of Applied Physics, The 42nd Spring Meeting, 1995 (29p–D–2). (No month).

Extended Abstracts, The Japan Society of Applied Physics, The 42nd Spring Meeting, 1995 (29p–D–3). (No month).

Extended Abstracts, The Japan Society of Applied Physics, The 56th Autumn Meeting, 1995 (27a–ZG–2). (No month).

Extended Abstracts, The Japan Society of Applied Physics, The 56th Autumn Meeting, 1995 (27a–ZG–3). (No month).

Extended Abstracts, The Japan Society of Applied Physics, The 43rd Spring Meeting, 1996 (28p–V–11). (No month).

Takashi Nakamura, Integrated Ferroelectrics, Preparation of $Bi_4Ti_3O_{12}$ Films . . . , vol. 6, pp. 35–46 (1995). (No month).

H. Matsunaga et al., Chemical Abstracts 124:248134 (1996). Jan.

G.A. Smolenskii et al., Soviet Phys. Solid State, A New Group of Ferroelectrics, 1,149, 1959. (No month).

E.C. Subbarao, J. Phys. Chem. Solids, A Family of Ferroelectric Bismuth Compounds, 23, 665, 1962. (No month).

S. Onishi et al., IEEE IEDM Technical Digest, A Half–Micron Ferroelectric Memory Cell . . . , p. 843, 1994. (No month).

Nakamura et al. (1993) Jpn. J. Appl. Phys., vol. 32, pp. 4086–4088 Sep.

Jia et al. (1995) Thin Solid Films, vol. 259 (No. 2) pp. 264–269 (No month).

* cited by examiner

//FERROELECTRIC THIN FILM COATED SUBSTRATE, PRODUCING METHOD THEREOF AND CAPACITOR STRUCTURE ELEMENT USING THEREOF

FIELD OF THE INVENTION

The present invention relates to a ferroelectric thin film coated substrate to be used in a ferroelectric memory device, a pyroelectric sensor device, a piezoelectric device, etc., a producing method thereof, and a capacitor structure element using the ferroelectric thin film coated substrate.

BACKGROUND OF THE INVENTION

Since ferroelectrics has a lot of advantages, such as spontaneous polarization, high dielectric constant, an electro-optic effect, a piezoelectric effect and a pyroelectric effect, it is applied to the development of various devices, such as a capacitor, an oscillator, a light modulator and an infrared sensor. Conventionally, in these applications, monocrystal, made of triglycine sulfate (TGS), $LiNbO_3$ and $LiTaO_3$ which are materials of the ferroelectrics, or a ceramic, which is made of $BaTiO_3$, $PbTiO_3$, Pb $(Zr_{1-x}Ti_x)O_3$ (PZT), PLZT, etc., was cut and was ground so as to have a thickness of approximately 50 μm. However, it is difficult and costly to produce large-sized monocrystal, and its processing is difficult due to cleavage. Moreover, since ceramics are generally fragile and it is difficult to process the ceramics so that it has a thickness of less than 50 μm due to a crack, etc. at a processing step, a lot of effort is required and its production cost becomes higher.

Meanwhile, as a technique for forming a thin film is developed, an application field for such a ferroelectric thin film is spreading at present. As an example of the applications, when high dielectric constant properties are applied to a capacitor for various semiconductor devices, such as DRAM, high integration of a element is realized by decreasing the capacitor size and reliability is improved. In particular, a high density ferroelectric nonvolatile memory (FRAM) which is operated at high speed has been developed by combining a ferroelectric thin film and a semiconductor memory element, such as DRAM, recently. The ferroelectric nonvolatile memory does not require backup battery because of utilization of the ferroelectric properties (hysteresis effect) of the ferroelectrics. The development of these devices require materials which have properties, such as large remanent spontaneous polarization (Pr), a small coercive electric field (Ec), a low leakage current and excellent endurance to repetition of polarization reversal. Moreover, in order to lower an operating voltage and to suitably perform semiconductor fine processing, it is desirable that the above properties are realized by a thin film with a thickness of less than 200 nm.

In order to achieve the application of the ferroelectric thin film to the FRAM, etc., an oxide ferroelectric thin film having a perovskite structure, such as $PbTiO_3$, PZT, PLZT, etc. is tried to be formed by thin film forming methods, such as sputtering method, vacuum evaporation method, sol-gel method and MOCVD (Metal-Organic Chemical Vapor Deposition) method.

In the above ferroelectric materials, Pb $(Zr_{1-x}Ti_x)O_3$ (PZT) is now being studied most intensively, and a thin film with excellent ferroelectric properties is obtained by the sputtering method and the sol-gel method. For example, a thin film, whose remanent spontaneous polarization Pr takes a large value in the range of 10 $\mu C/cm^2$ to 26 $\mu C/cm^2$, is obtained. However, although the ferroelectric properties of PZT greatly depend upon composition x, PZT contain Pb whose vapor pressure is high, so decrease in a film thickness arises a problem that the leakage current and fatigue in the endurance to polarization reversal are caused because film component is liable to change at the time of film formation and of heat treatment, a pinhole is produced, a low dielectric constant layer is obtained due to reacting between a ground electrode Pt and Pb, etc. For this reason, it is desired that another materials whose ferroelectric properties and the endurance to polarization reversal are excellent are developed. Moreover, in the case of the application to an integrated device, a fine grain of a thin film, which corresponds to fine processing, is required.

Bi layered oxide materials such as $SrBi_2Ta_2O_9$ have attracted interest as the materials with fatigue free property. A thin film of $SrBi_2Ta_2O_9$ is produced by a MOD method. The MOD method is a method for forming a film including the following processes. Namely, like the sol-gel method, metalorganic raw materials are mixed so that fixed film composition is obtained, and a raw material solution for application whose concentration and viscosity are adjusted is produced. A substrate is spin-coated with the produced raw material solution and the substrate is dried. Then, in order to remove the organic element and solvent, the substrate is heated to form the amorphous film. These processes are repeated until the fixed film thickness is obtained, and finally, the substrate is crystallized by sintering. Therefore, the film thickness is controlled by adjusting the thickness of a once-applied film (see Extended Abstracts (The 55th Autumn Meeting, 1194): The Japan Society of Applied Physics, 20 p-M-19).

The most serious problem of $SrBi_2Ta_2O_9$ thin film formation is that since the sintering temperature is very high, namely, 750° C.–800° C., a long sintering time, namely, longer than 1 hour, is required. In such a manufacturing process, when the processes, such as film formation and heat treatment are performed for a long time at the temperature of not lower than 650° C., a mutual diffusion reaction between a platinum metal electrode as a substrate and the ferroelectrics and reactions between silicon or oxidized silicon under the ground electrode and the electrode or the ferroelectrics are taken place. Moreover, the film composition is changed due to volatilization of a composition element from the ferroelectric thin film, and thus the application to the actual device producing process becomes difficult. Moreover, since only a film, having surface morphology of a large grain size of approximately 0.3 am, is obtained at present, the film cannot be applied to the submicron fine processing which is required for the development of highly integrated devices. Moreover, in the case of the coated film, since a coating method is disadvantageous of a step coverage, there arises a problem of disconnection of a wiring, etc. Therefore, as to $SrBi_2Ta_2O_9$, its ferroelectric properties and its fatigue free property are excellent, but it still has a serious problem for application to devices.

In addition, in order to realize high integration of the ferroelectric nonvolatile memory at present, it is proposed to use a polycrystal silicon plug for wiring between a MOS transistor and a ferroelectric capacitor, but in the case where a ferroelectric thin film is produced by a long-time and high temperature process used for $SrBi_2Ta_2O_9$, there arises a problem that its properties deteriorate. due to mutual diffusion between the polycrystal silicon used for wiring and the ferroelectric thin film. In order to solve such a problem, a structure where various diffusion barrier layers are inserted is examined, but even in such a structure, the permitted limit of a forming temperature of the ferroelectric thin film is up to 650° C., and on another short-time heat treatment process, the permitted limit is up to approximately 700° C. However, at present in the ferroelectric thin film made of $SrBi_2Ta_2O_9$ or the like, in general, as the film forming temperature is higher, the ferroelectric properties as well as crystallinity are more improved. Therefore, when the film forming temperature is lowered, the crystallinity and the ferroelectric properties are deteriorated, so it is difficult to achieve both the improvement in the ferroelectric properties and the low film forming temperature in the ferroelectric thin film.

On the other hand, an example of oxide ferroelectrics excluding Pb, which exerts a bad influence upon the leakage current and the resistance to polarization reversal, is $Bi_4Ti_3O_{12}$ having a layered perovskite structure. Such $Bi_4Ti_3O_{12}$ is ferroelectrics having the layered perovskite structure whose anisotropy is strong (orthorhombic system/lattice constants: a=5.411 Å, b=5.448 Å, c=32.83 Å). As to ferroelectricity of its monocrystal, in the a-axis, the remanent spontaneous polarization Pr is 50 $\mu C/cm^2$ and the coercive electric field Ec is 50 kV/cm, namely, the ferroelectrics has the largest spontaneous polarization in the above Bi oxide ferroelectrics so $Bi_4Ti_3O_{12}$ shows excellent properties. Therefore, in order to apply the large spontaneous polarization of $Bi_4Ti_3O_{12}$ to the ferroelectric nonvolatile memory, etc., it is desirable that the $Bi_4Ti_3O_2$ has a lot of a-axial composition of the crystal in the direction which is perpendicular to the substrate.

Thinning of $Bi_4Ti_3O_{12}$ thin film has been tried by the MOCVD method and the sol-gel method, but these attempts mostly brought c-axis-oriented films whose spontaneous polarization is smaller than a-axis-oriented films. Moreover, in the conventional sol-gel method, the heat treatment of not lower than 650° C. is required for obtaining the excellent ferroelectric properties, and since its surface morphology is composed of crystal grains of approximately 0.5 $\mu m$, it is difficult to apply the thin film to the highly integrated devices which requires fine processing.

Meanwhile, a c-axis-oriented $Bi_4Ti_3O_{12}$ thin film is formed by the MOCVD method on a $Pt/SiO_2/Si$ substrate and a Pt substrate at a substrate temperature of not lower than 600° C., but these substrates cannot be directly applied to an actual device structure. In other words, like the $Pt/Ti/SiO_2/Si$ substrate, an adhesive layer, such as a Ti film, is required for obtaining adhesive strength between a Pt electrode layer and $SiO_2$ below it. However, in the case where the $Bi_4Ti_3O_{12}$ thin film is formed by the MOCVD method on the Pt electrode substrate to which such an adhesive layer is provided, it is reported that its film surface morphology is composed of coarse crystal grains and that pyrochlore phase ($Bi_2Ti_2O_7$) is liable to occur (see Jpn. J. Appl. Phys., 32, 1993, pp.4086, and J. Ceramic Soc. Japan, 102, 1994, pp.512). In the case where the film surface morphology is composed of coarse crystal grains, the film cannot be applied to the highly integrated devices which require fine processing, and furthermore, a thin thickness causes a pinhole, thereby generating a leakage current. Therefore, in such a conventional technique, it is difficult to realize the ferroelectric thin film which has excellent ferroelectric properties in the case of a thin film thickness of not more than 200 nm.

As mentioned above, in order to apply a ferroelectric thin film to highly integrated devices, the above prior art cannot provide a ferroelectric thin film, which sufficiently fulfills various conditions, such as denseness and evenness on the thin film surface required for fine processing and a low leakage current, large remanent spontaneous polarization, and a film forming process at a low temperature.

SUMMARY OF THE INVENTION

It is an object of the present invention to provide a ferroelectric thin film coated substrate, where a ferroelectric thin film with a dense and even surface, an excellent low leakage current properties and sufficiently large remanent spontaneous polarization, can be produced at a lower temperature, a method of producing the ferroelectric thin film coated substrate and a capacitor structure element using the ferroelectric thin film coated substrate.

In order to achieve the above object, a ferroelectric thin film coated substrate of the present invention is produced by the following characteristic steps of:

forming a metal oxide buffer layer on a substrate;

forming a first crystalline ferroelectric thin film with a first film thickness on the metal oxide buffer layer at a first substrate temperature; and forming a second ferroelectric thin film with a second film thickness thicker than the first film thickness on the first ferroelectric thin film at a second substrate temperature lower than the first substrate temperature.

In accordance with the above arrangement, since the first ferroelectric thin film is positioned through the metal oxide buffer layer, even when the first ferroelectric thin film has a thin film thickness, a thin film having satisfactory crystallinity can be formed. Therefore, in the case where the first ferroelectric thin film is used as a background layer, even if the second ferroelectric thin film with a thicker second film thickness at the film forming temperature (substrate temperature) which is lower than the film forming temperature (substrate temperature) of the first ferroelectric thin film, sufficient ferroelectricity can be secured due to inheritance of excellent crystallinity of the first ferroelectric thin film. Moreover, when the second ferroelectric thin film is formed at a lower temperature, the crystal grains composing the thin film can be prevented from becoming rough and large, thereby making it possible to obtain the dense ferroelectric thin film whose surface is even.

In other words, when the ferroelectric thin film coated substrate of the present invention is arranged so that the second ferroelectric thin film with an enough film thickness for showing ferroelectricity is positioned on the substrate through the metal oxide buffer layer and the first ferroelectric thin film with a thin film thickness, the ferroelectric thin film which has sufficient ferroelectricity and has excellent evenness and denseness can be obtained.

In addition, in the ferroelectric thin film coated substrate of the present invention, since the ferroelectric thin film has excellent evenness and denseness, fine processing becomes possible, and the substrate is applicable to various highly integrated devices. Moreover, if the substrate is applied to various devices including the capacitor structure element of the present invention, production of a pin hole is prevented, thereby making it possible to improve the leakage current properties.

It is desirable that the ferroelectric thin film coated substrate of the present invention is produced such that after the first ferroelectric thin film is formed on the metal oxide buffer layer positioned on the substrate by heating the substrate by means of the MOCVD method, the second ferroelectric thin film is formed by the MOCVD method at a substrate temperature which is lower than that in forming the first ferroelectric thin film.

In addition, it is desirable that the substrate temperature in forming the first ferroelectric thin film (first substrate temperature) is in the range of 450° C. to 650° C., and the substrate temperature in forming the second ferroelectric thin film (second substrate temperature) is in the range of 400° C. to 500° C. (however, the range of 450° C. to 500° C. is limited to the case where the second substrate temperature is lower than the first substrate temperature).

In the producing method of the present invention, the substrate temperature in forming the first ferroelectric thin film is slightly higher, but it is enough lower compared with the conventional method, and the process for forming the first ferroelectric thin film requires a short time because its thickness may thin. Therefore, there is little effect of the substrate temperature.

Therefore, in accordance with the method of producing the ferroelectric thin film coated substrate of the present invention, since the ferroelectric thin film is formed at a very low temperature during almost the whole process, the substrate is applicable to a highly integrated device provided with a plurality of elements without damaging another elements. Furthermore, a degree of freedom in design can be remarkably improved.

DETAILED DESCRIPTION OF THE PREFERRED EMBODIMENTS

The following describes one embodiment of the present invention on reference to FIGS. 1 through 5.

Figure 1:
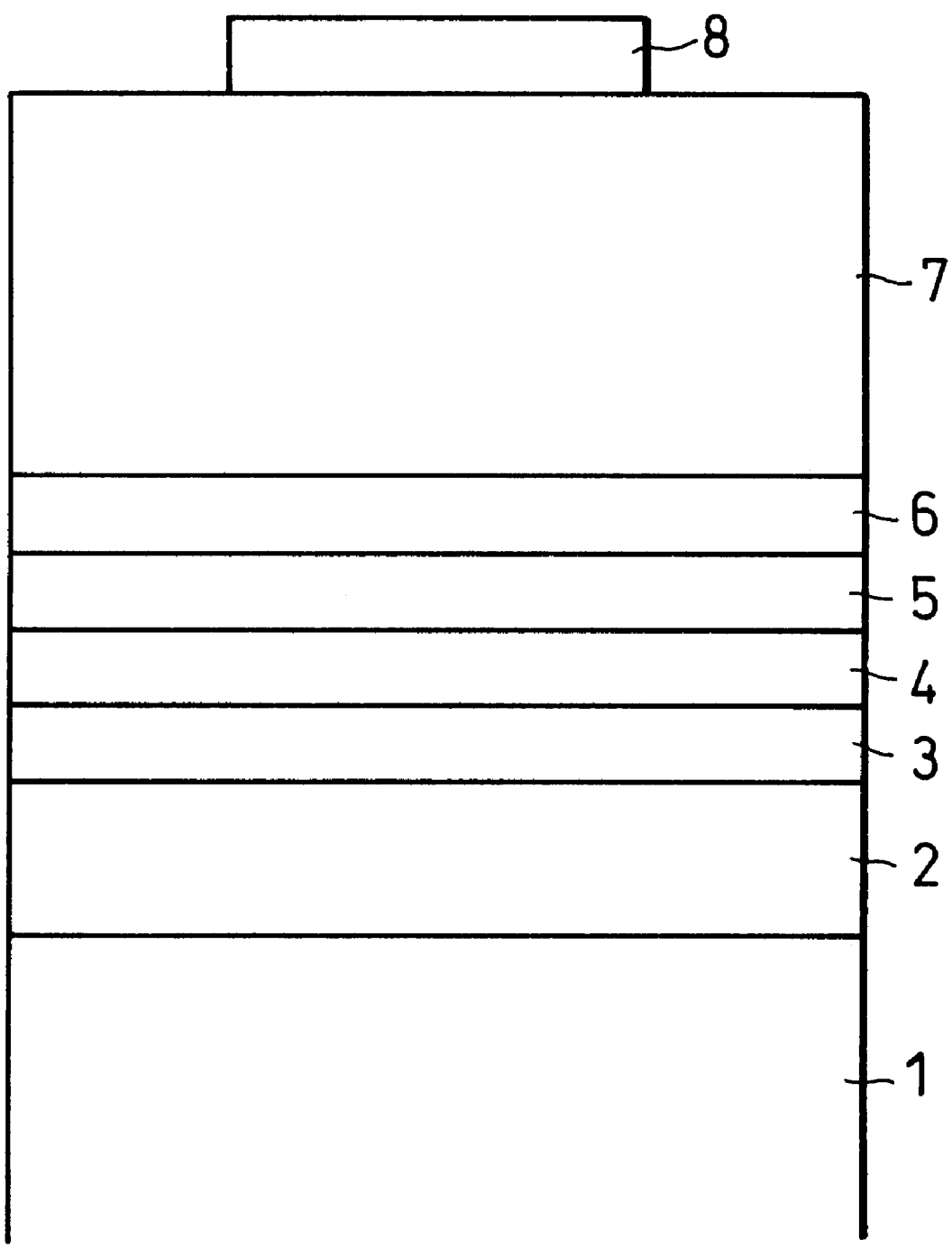
FIG. 1 is a schematic cross sectional view which shows an arrangement of a capacitor structure element using a ferroelectric thin film coated substrate according to embodiment of the present invention.

FIG. 1 is a drawing which shows an arrangement of a capacitor structure element according to one embodiment of the present invention. As shown in FIG. 1, the capacitor structure element is arranged so that a silicon oxide ($SiO_2$) layer 2, an adhesive layer 3, a lower electrode 4, a metal oxide buffer layer 5, a first ferroelectric thin film 6, a second ferroelectric thin film 7 and an upper electrode layer 8 are formed on a silicon (Si) substrate 1 in this order.

In the present embodiment, a silicon monocrystal wafer is used as the silicon substrate 1, and a silicon oxide thin film obtained by thermally oxidizing the surface of the silicon monocrystal wafer is used as the $SiO_2$ layer 2. Moreover, a tantalum (Ta) thin film as the adhesive layer 3, a platinum (Pt) thin film as the lower electrode 4, a titanium oxide thin film as the metal oxide buffer layer 5, bismuth titanate thin films as the first ferroelectric thin film 6 and the second ferroelectric thin film 7, and a platinum (Pt) thin film as the upper electrode 8 are used.

Next, the following describes a method of producing the capacitor structure element of the present embodiment shown in FIG. 1. At first, a method of producing a Pt/Ta/$SiO_2$/Si substrate is described. The surface of the silicon monocrystal wafer (100) as the silicon substrate 1 is thermally oxidized so that the $SiO_2$ layer 2 with thickness of 200 nm is formed. Then, the Ta thin film as the adhesive layer 3 and the Pt thin film as the lower electrode 4 are formed by sputtering method so that they respectively have a thickness of 30 nm and a thickness of 200 nm.

Here, the materials and the film thicknesses are not necessarily limited to the present embodiment. For example, a silicon polycrystal substrate, a GaAs substrate, etc. may be used instead of the silicon monocrystal substrate. The adhesive layer 3 prevents peeling of a film due to a difference in the coefficient of thermal expansion between the substrate and the lower electrode 4 during film forming, and its film thickness may take any value as long as it can prevent the peeling of the film. Moreover, titanium (Ti) etc. can be used as its material instead of Ta, but in the present embodiment, use of Ta is desirable because the use of Ti produces alloy of Ti and Pt. Furthermore, the $SiO_2$ layer used as an insulating layer is not necessarily formed by thermal oxidation, so an SiO2 film, a silicon nitride film etc., which are formed by the sputtering method, vacuum evaporation method, MOCVD method, etc., can be used, and the material and film thickness are not necessarily limited as long as the $SiO_2$ film has sufficient insulation.

In addition, the lower electrode 4 may have any film thickness as long as it can function as an electrode layer. Its material is not necessarily limited to Pt, so it may be a conductive material to be used as an usual electrode material, so the material can be suitably selected according to the relation with another thin films.

Moreover, the film forming method is not necessarily limited to the silicon thermal oxidation and the sputtering methods until the lower electrode is formed, so usual thin film forming technique, such as the vacuum evaporation method can be used. Moreover, the structure of the substrates is not necessarily limited to the above.

Successively, the titanium oxide thin film as the metal oxide buffer layer 5 was formed on the Pt/Ta/$SiO_2$/Si substrate produced in the above manner by the MOCVD method. When the titanium oxide thin film was formed, titanium (IV) tetra-i-propoxide ($Ti(i-OC_3H_7)_4$) was used as a titanic material, and this is heated and vaporized to 50° C. so as to be supplied to a film forming chamber together with argon (Ar) gas which is carrier gas. Here, the flow rate of the Ar gas was 100 sccm. In the film forming chamber, the Pt/Ta/$SiO_2$/Si substrate produced in the above manner was heated and maintained at 450° C., and the titanium oxide thin film with a film thickness of 5 nm was formed on the Pt/Ta/$SiO_2$/Si substrate. This film forming process of the titanium oxide thin film required about 30 seconds.

Thereafter, the thin film composed of bismuth titanate containing titanium which is a metallic element composing titanium oxide was formed as the first ferroelectric thin film 6 on the titanium oxide thin film by the MOCVD method. The bismuth titanate thin film with a film thickness of about 5 nm was formed at a substrate temperature of 600° C. for about 2 minutes. The conditions of supplying raw materials in forming the film by means of the MOCVD method are shown in TABLE 1.

TABLE 1

| Raw material | $Bi(O-C_7H_7)_3$ | $Ti(i-OCH_3H_7)_4$ |
|---|---|---|
| Temperature of raw material | 160° C. | 50° C. |
| Flow rate of carrier | 200 sccm | 50 sccm |

TABLE 1-continued

| | |
|---|---|
| gas (Ar) Flow rate of reaction gas ($O_2$) | 1000 sccm |
| Film forming pressure | 5 Torr |

As shown in TABLE 1, when the bismuth titanate thin film was formed, tri-o-tolyl bismuth ($Bi(o-C_7H_7)_3$) as a bismuth raw material and titanium (IV) tetra-i-propoxide ($Ti(i-OC_3H_7)_4$) as a titanium raw material were used, and these raw materials were respectively heated and vaporized so as to be at the temperatures of raw materials shown in TABLE 1 (bismuth raw material: 160° C., titanium raw material: 50° C.). Then, they were supplied to the film forming chamber together with argon (Ar) gas as carrier gas and gaseous oxygen ($O_2$) as reaction gas. Here, the flow rate of the Ar gas was 200 sccm with respect to the Bi raw material and was 50 sccm with respect to the Ti raw material. The flow rate of the $O_2$ gas was 1000 sccm. Here, in these film forming processes, if a gas pressure in the film forming chamber is higher than 10 Torr, gas phase reaction is liable to take place, so the gas pressure was 5 Torr.

When the bismuth titanate thin film with a film thickness of 100 nm was formed under the above conditions and its composition and crystallinity were examined by composition analyzer EPMA (Electron Probe Microanalysis) and an X-ray diffraction method, Bi/Ti composition ratio was about 1.3, so it was found that the bismuth titanate thin film was composed of $Bi_4Ti_3O_{12}$ with stoichiometry composition and it was a c-axis oriented thin film.

After the bismuth titanate thin film as the first ferroelectric thin film 6 (hereinafter, referred to as the first bismuth titanate thin film) was formed, supplying of the raw materials was stopped, and the same raw materials were again supplied with the substrate temperature maintained at 400° C. so that a bismuth titanate thin film composed of the same materials as the first ferroelectric thin film of the present embodiment (hereinafter, referred to as the second bismuth titanate thin film) was formed. The film forming time was about 1 hour, and the sum of the film thicknesses of the first and second bismuth titanate thin films was about 100 nm. Here, the film thickness of the second bismuth titanate thin film was about 95 nm, that is thicker than the first bismuth titanate thin film with a film thickness of 5 nm.

Figure 2:
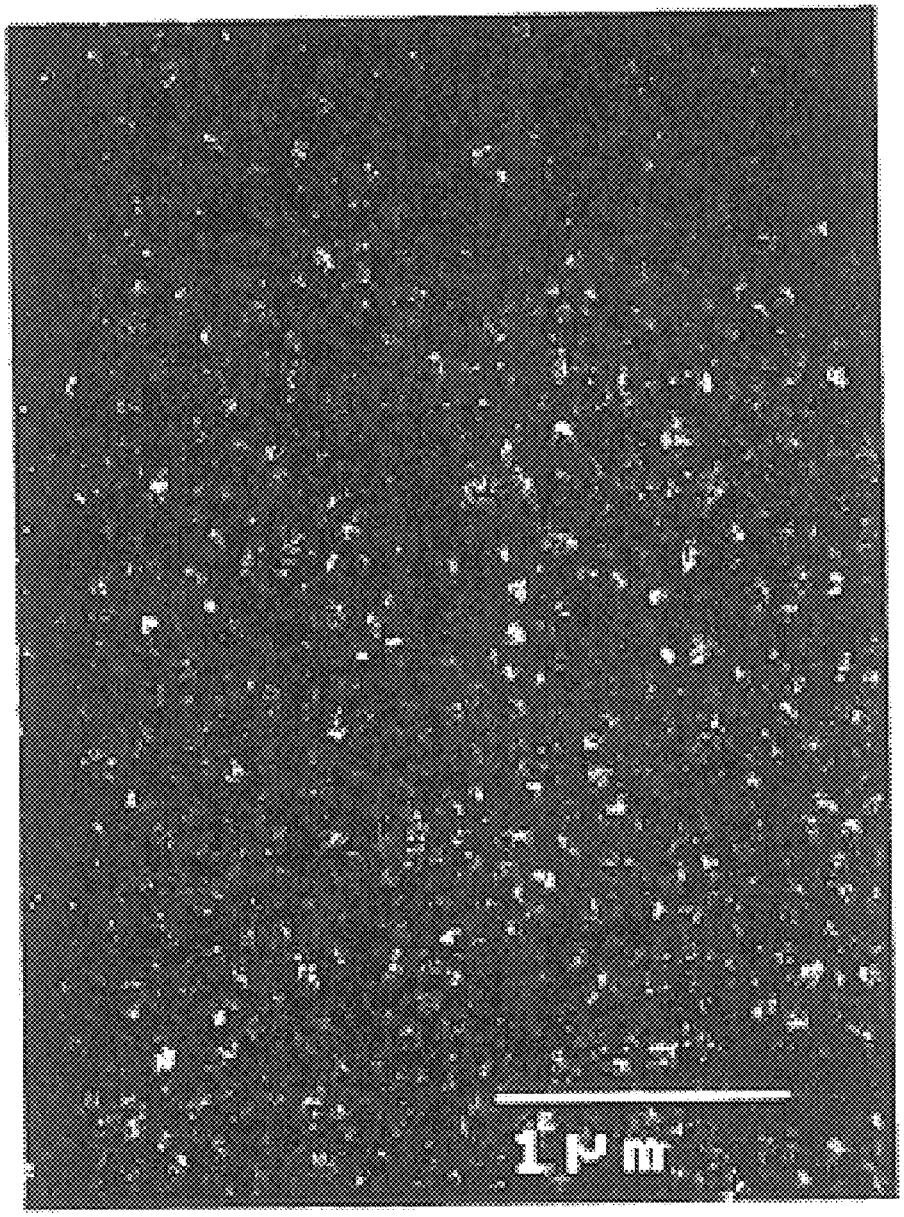
FIG. 2 is a photograph which shows a result of examining a surface of a second bismuth titanate thin film of the present embodiment by means of SEM (Scanning Electron Microscope).

The results of observing the surface morphology of the second bismuth titanate thin film formed in the above manner by means of SEM (Scanning Electron Microscope) are shown in FIG. 2. According to FIG. 2, the second bismuth titanate thin film of the present invention is composed of grains with a particle diameter of about 0.1 $\mu$m, so that the thin film is dense and even.

Figure 3:
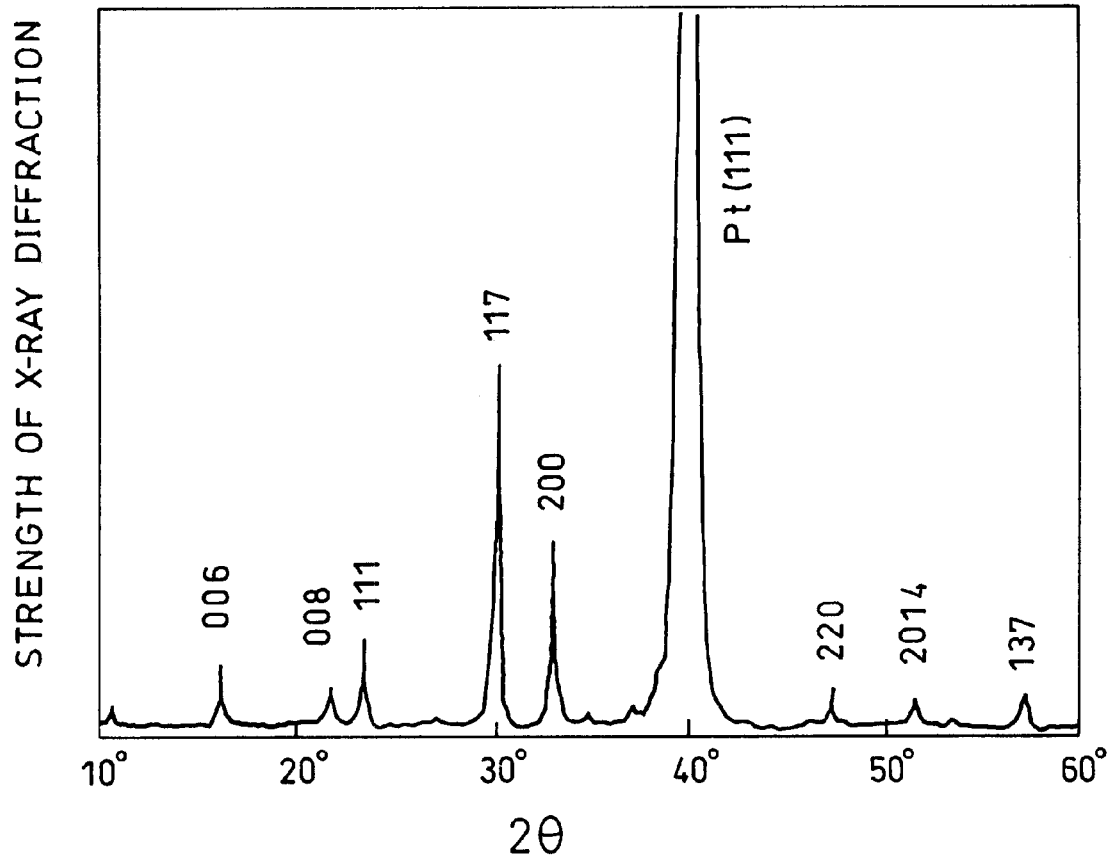
FIG. 3 is a drawing which shows an observation result of the second bismuth titanate thin film, which is a ferroelectric thin film of the above ferroelectric thin film coated substrate by X-ray diffraction.
Figure 4:
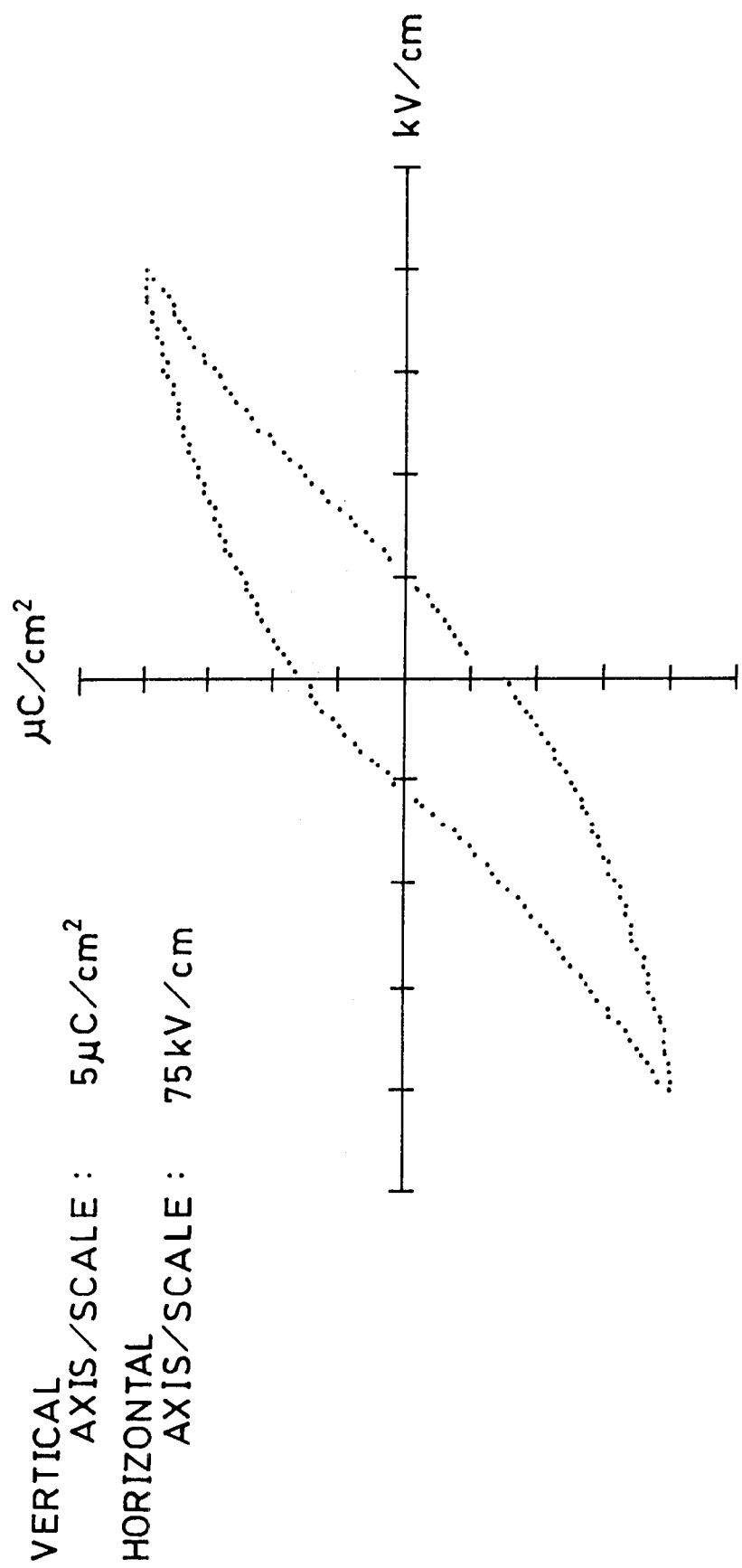
FIG. 4 is a graph which shows a ferroelectric hysteresis curve of the capacitor structure element.

In addition, results of examining the crystallinity of the bismuth titanate thin film by means of the X-ray diffraction are shown in FIG. 3.

In FIG. 3, the X-ray diffraction intensity is used to enter the vertical axis, and a diffraction angle 2θ (deg) is used to enter the horizontal axis. (001) (1 is integer) represents the diffraction peak due to the c-axis-orientation of $Bi_4Ti_3O_{12}$, and (200) represents the diffraction peak due to the a-axis-orientation of $Bi_4Ti_3O_{12}$. (111), (117), (220), (2014) and (137) respectively represent the diffraction peak due to the random orientation including the a-axis composition of $Bi_4Ti_3O_{12}$, and the diffraction peak of Pt (111) in the vicinity of 2θ=40° (deg) is due to Pt as the lower electrode 4.

According to the X-ray diffraction pattern in FIG. 3, $Bi_4Ti_3O_{12}$ in which the a-axis-orientation, the c-axis-orientation and the random orientation are mixed, namely, which has random orientation composition, is formed in the second bismuth titanate thin film. As a result, it was confirmed that the $Bi_4Ti_3O_{12}$ thin film with the random orientation composition is formed on the first c-axis-oriented $Bi_4Ti_3O_{12}$ thin film in the present embodiment.

For comparison, the $Pt/Ta/SiO_2/Si$ substrate, which is same as that of the present embodiment, was used, and the bismuth titanate thin film was formed just on Pt under the same condition (substrate temperature of 400° C.) as that in forming the second bismuth titanate thin film. The formed bismuth titanate thin film showed an amorphous structure (noncrystal). Namely, unlike the present embodiment, in the thin film where the above titanium oxide buffer layer and the first bismuth titanate thin film were not formed, the bismuth titanate thin film was not crystallized and thus only the amorphous structure was obtained. Therefore, it found that the metal oxide buffer layer 5 and the first ferroelectric thin film 6 of the present invention makes it possible to form the ferroelectric thin film showing crystallinity at the very low substrate temperature of 400° C., at which a crystalline thin film cannot be usually obtained. Such effects of the present invention are produced because the second ferroelectric thin film 7 inherits the crystal state from the first ferroelectric thin film 6 with thin film thickness.

In addition, when the bismuth titanate thin film of the present embodiment was examined by composition analyzer EPMA (Electron Probe Microanalysis), its Bi/Ti composition ratio was 0.9. This means that the composition of the second bismuth titanate thin film greatly shifted from stoichiometry composition of $Bi_4Ti_3O_{12}$ (about 1.3). As a result, in the second bismuth titanate thin film of the present embodiment, the crystalline $Bi_4Ti_3O_{12}$ partially has the amorphous structure (noncrystal), and it is considered that such film composition can realize dense and even thin films with an even surface.

Next, the titanium oxide buffer layer, the first bismuth titanate thin film and the second bismuth titanate thin film are successively formed on the $Pt/Ta/SiO_2/Si$ substrate so that the ferroelectrics coated substrate is produced. A Pt electrode (100 $\mu m^2$) as the upper electrode 8 was formed on the ferroelectrics coated substrate by the vacuum evaporation method so that a capacitor structure element shown in FIG. 1 was produced.

Here, the produced upper electrode 8 also may have any film thickness as long as it functions as an electrode like the lower electrode 4, and its material is not necessarily limited to Pt, so a conductive material for an usual electrode material may be used. Moreover, as to the film forming method, the sputtering method as well as the vacuum evaporation method can be used.

A voltage was applied across the lower electrode 4 and the upper electrode 8 shown in FIG. 1, and the ferroelectric properties of the capacitor structure element in the present embodiment were evaluated. Its result was represented by a ferroelectric hysteresis curve shown in FIG. 4. In other words, when the voltage of 3V was applied, the capacitor structure element of the present embodiment showed the properties that the remanent spontaneous polarization Pr was 7.5 $\mu C/cm^2$ and that the coercive electric field Ec was 70 kV/cm. This value Pr is nearly twice as large as Pr of 4 $\mu C/cm^2$ in the c-axis direction which is obtained in $Bi_4Ti_3O_{12}$ monocrystal (bulk).

A reason for that the capacitor structure element of the present embodiment obtains the large remanent spontaneous polarization Pr of 7.5 μC/cm² is as follows. Namely, the value Pr in the a-axis direction of the $Bi_4Ti_3O_{12}$ is larger than the value in the c-axis direction, and the randomly oriented ferroelectrics $Bi_4Ti_3O_{12}$ is shown by the examination through the X-ray diffraction in the present embodiment. Therefore, the a-axis orientation compositions of the $Bi_4Ti_3O_{12}$ ferroelectrics greatly contributes to the large remanent spontaneous polarization.

Figure 5:
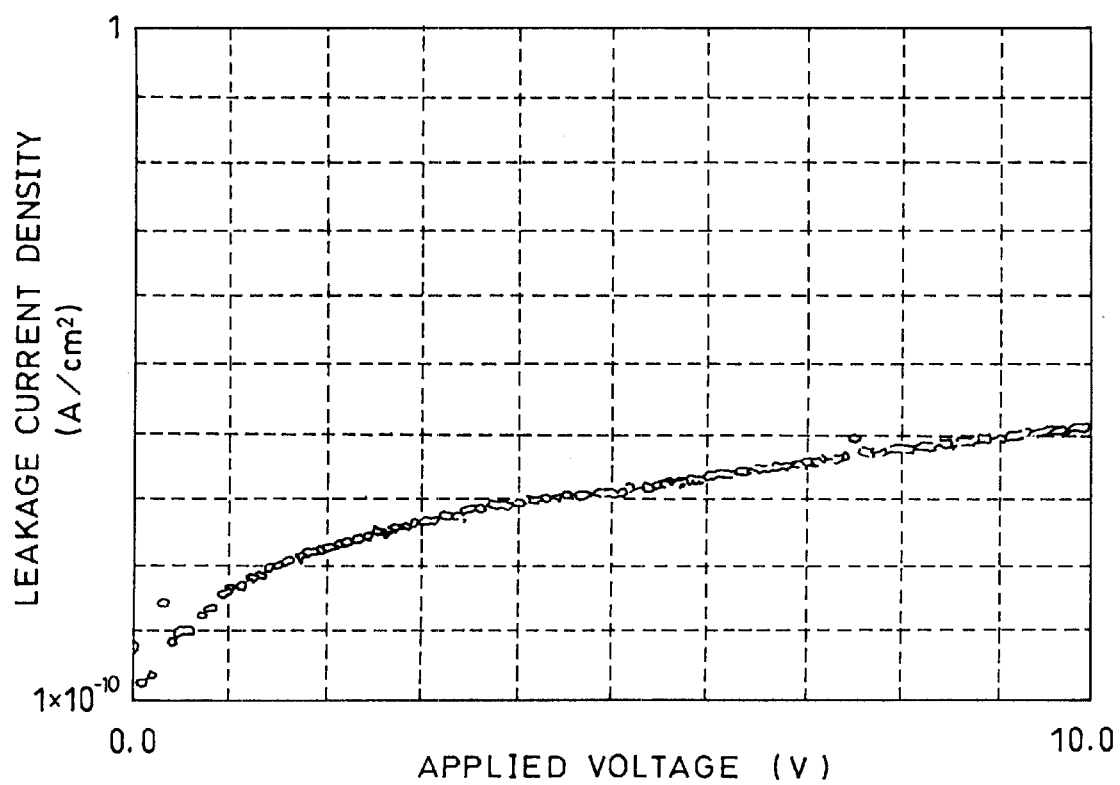
FIG. 5 is a graph which shows an applied voltage dependency of leakage current density of the capacitor structure element.

In addition, in the capacitor structure element in the present embodiment, leakage current density Il was measured, and its result is shown in FIG. 5. According to FIG. 5, when a voltage of 3V is applied, the leakage current density Il took a small and favorable value of $8 \times 10^{-8}$ A/cm². This is because, as mentioned above, the dense bismuth titanate thin film with excellent evenness suppresses the production of a pinhole, and thus the leakage current properties can be greatly improved.

Here, in the above embodiment, the substrate temperature in forming the first ferroelectric thin film 6 by means of the MOCVD method was 600° C., and the substrate temperature in forming the second ferroelectric thin film 7 was 400° C., but the substrate temperatures are not necessarily limited to them. In other words, when the first ferroelectric thin film 6 and the second ferroelectric thin film 7 were formed under the conditions that the substrate temperature in forming the first ferroelectric thin film 6 was in the range of 450° C. to 650° C., the substrate temperature in forming the second ferroelectric thin film 7 was in the range of 400° C. to 500° C. and the substrate temperature in forming the second ferroelectric thin film 7 was lower than the substrate temperature in forming the first ferroelectric thin film, the satisfactory result was obtained similarly to the above embodiment.

In the above embodiment, $Bi_4Ti_3O_{12}$ was used as the material of the ferroelectric material, but the material is not necessarily limited to this. Therefore, $SrBi_2Nb_2O_9$, $SrBi_2Ta_2O_9$, $BaBi_2Nb_2O_9$, $BaBi_2Ta_2O_9$, $PbBi_2Nb_2O_9$, $PbBi_2Ta_2O_9$, $SrBi_4Ti_4O_{15}$, $BaBi_4Ti_4O_{15}$, $PbBi_4Ti_4O_{15}$, $Na_{0.5}Bi_{4.5}Ti_4O_{15}$, $K_{0.5}Bi_{4.5}Ti_4O_{15}$, $Sr_2Bi_4Ti_5O_{18}$, $Ba_2Bi_4Ti_5O_{18}$, $Pb_2Bi_4Ti_5O_{18}$, etc. which are Bi ferroelectric materials having the same layered perovskite structure can be applied to the present invention.

In the above embodiment, the capacitor structure element uses the $Pt/Ta/SiO_2/Si$ substrate as the substrate, but such a substrate is not necessarily limited to this. For example, the capacitor structure element may be arranged so that an integrated circuit is formed on a Si or GaAs substrate, the surface of the integrated circuit is covered with an layer insulating film made of silicon oxide, silicon nitride, etc., an electrode layer, which is electrically connected to an element of the integrated circuit through a contact hole formed on one portion of the layer insulating film, is formed on the layer insulating film, and the ferroelectric thin film of the present invention is formed on the electrode layer. In other words, the present invention is applicable to an integrated circuit element which is electrically connected to an element of an integrated circuit and various highly integrated devices which have the capacitor structure of the above embodiment and a transistor structure.

In addition, in the above embodiment, metallic element composing the metal oxide buffer layer 5 is same as one of the composition elements of the first ferroelectric thin film 6 and one of the composition elements of the second ferroelectric thin film 7, but the metallic element is not necessarily limited to this. In other words, when at least one of the metallic elements composing the metal oxide buffer layer 5 is same as one of the composition elements of the first ferroelectric thin film 6 or the second ferroelectric thin film 6, contamination is suppressed.

Since the ferroelectric thin film coated substrate in the present embodiment can realize the ferroelectric thin film with satisfactory evenness and denseness which has the sufficient ferroelectric properties, even if the film thickness is 100 nm that is extremely thin, the leakage current properties can be greatly improved. Furthermore, the ferroelectric thin film coated substrate can correspond to various fine processing, and it is effective for the application to the highly integrated devices.

In addition, since the method of producing the ferroelectric thin film according to the present embodiment makes it possible to form the ferroelectric thin film with satisfactory crystallinity at the low temperature of 400° C., as mentioned above, mostly in the forming process of the ferroelectric thin film, the ferroelectric thin film is applicable to the highly integrated devices. Moreover, since not the conventional film coating methods, such as the MOD method and the sol-gel method, but the MOCVD method is used, the ferroelectric thin film with a large area and satisfactory controllability of its film thickness can be produced at a high speed, thereby making it possible to greatly improve the productivity.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A ferroelectric thin film coated substrate, comprising:
   a substrate;
   a metal oxide buffer layer formed on said substrate;
   a first ferroelectric thin film with a first film thickness, which is crystalline, said first ferroelectric thin film being formed on said metal oxide buffer layer at a first substrate temperature; and
   a second ferroelectric thin film with a second film thickness thicker than the first film thickness, said second ferroelectric thin film being formed on said first ferroelectric thin film at a second substrate temperature which is lower than the first substrate temperature.

2. The ferroelectric thin film coated substrate as defined in claim 1, wherein composition elements of said first ferroelectric thin film are the same as composition elements of said second ferroelectric thin film and a composition ratio of the composition elements of the first ferroelectric thin film is different from a composition ratio of the composition elements of the second ferroelectric thin film.

3. The ferroeletric thin film coated substrate as defined in claim 1, wherein a metallic element composing said metal oxide buffer layer is the same as at least one of the composition elements of said first or second ferroelectric thin film.

4. The ferroelectric thin film coated substrate as defined in claim 3, wherein said metal oxide buffer layer is made of titanium oxide, said first ferroelectric thin film comprises bismuth titanate and said second ferroelectric thin film comprises bismuth titanate.

5. The ferroelectric thin film coated substrate as defined in claim 4, wherein said first ferroelectric thin film comprises $Bi_4Ti_3O_{12}$ having mainly c-axis orientation and said second ferroelectric thin film comprises $Bi_4Ti_3O_{12}$ having random orientation.

6. The ferroelectric thin film coated substrate as defined in claim 1, wherein said first ferroelectric thin film and said second ferroelectric thin film each comprise a Bi ferroelectric material having a layered perovskite structure.

7. The ferroelectric thin film coated substrate as defined in claim 1, wherein:
   the first substrate temperature is in the range of 450° C. to 650° C.,
   the second substrate temperature is in the range of 400° C. to 500° C. (however, the range of 450° C. to 500° C. is limited to the case where the second substrate temperature is lower than the first substrate temperature).

8. A method of producing a ferroelectric thin film coated substrate, comprising:
   the first step of forming a metal oxide buffer layer on a substrate;
   the second step of forming a first ferroelectric thin film with a first film thickness, which is crystalline, on said metal oxide buffer layer at a first substrate temperature; and
   the third step of forming a second ferroelectric thin film with a second film thickness thicker than the first film thickness on said first ferroelectric thin film at a second substrate temperature which is lower than the first substrate temperature.

9. The producing method as defined in claim 8, wherein:
   said second step is the step of heating the substrate to the first substrate temperature so as to form said first ferroelectric thin film on said metal oxide buffer layer by means of a MOCVD method,
   said third step is the step of forming said second ferroelectric thin film on said first ferroelectric thin film by the MOCVD method with the substrate being maintained at the second substrate temperature.

10. The producing method as defined in claim 9, wherein said first step is a step of forming said metal oxide-buffer layer on the substrate by a MOCVD method.

11. The producing method as defined in claim 8, wherein:
   the first substrate temperature in said second step is in the range of 450° C. to 650° C., the second substrate temperature in said third step is in the range of 400° C. to 500° C. (however, the range of 450° C. to 500° C. is limited to the case where the second substrate temperature is lower than the first substrate temperature).

12. A capacitor structure element, comprising:
   a substrate;
   a metal oxide buffer layer formed on said substrate;
   a first ferroelectric thin film with a first film thickness, which is crystalline, formed on said metal oxide buffer layer at a first substrate temperature;
   a second ferroelectric thin film with a second film thickness thicker than the first film thickness, said second ferroelectric thin film being formed on said first ferroelectric thin film at a second substrate temperature lower than the first substrate temperature;
   a lower electrode made of a conductive material formed between said substrate and said metal oxide buffer layer; and
   an upper electrode made of a conductive material formed on said second ferroelectric thin film.

13. A ferroelectric thin film coated substrate, comprising:
   a substrate;
   a metal oxide buffer layer formed on said substrate;
   a first ferroelectric thin film formed on said metal oxide buffer layer, said first ferroelectric thin film being crystalline; and
   a second ferroelectric thin film with a film thickness thicker than that of said first ferroelectric thin film, said second ferroelectric thin film formed on said first ferroelectric thin film, said second ferroelectric thin film being crystalline and partially amorphous.

* * * * *

UNITED STATES PATENT AND TRADEMARK OFFICE
CERTIFICATE OF CORRECTION

PATENT NO.     : 6,440,591 B1
DATED          : August 27, 2002
INVENTOR(S)    : Hironori Matsunaga et al.

It is certified that error appears in the above-identified patent and that said Letters Patent is hereby corrected as shown below:

<u>Title page,</u>
Item [30], Foreign Application Priority Data,
Please insert as follows:
-- [30]         Foreign Application Priority Data
June 9, 1995 (JP) …………………………..7-168118 --.

Signed and Sealed this

Twenty-third Day of September, 2003

JAMES E. ROGAN
*Director of the United States Patent and Trademark Office*